(12) United States Patent
Li et al.

(10) Patent No.: US 11,740,832 B2
(45) Date of Patent: Aug. 29, 2023

(54) DATA STORAGE AND READING METHOD AND DEVICE

(71) Applicant: Beijing Tsingmicro Intelligent Technology Co., Ltd., Beijing (CN)

(72) Inventors: Cheng Li, Beijing (CN); Peng Ouyang, Beijing (CN); Zhen Zhang, Beijing (CN)

(73) Assignee: BEIJING TSINGMICRO INTELLIGENT TECHNOLOGY CO., LTD., Beijing (CN)

( * ) Notice: Subject to any disclaimer, the term of this patent is extended or adjusted under 35 U.S.C. 154(b) by 214 days.

(21) Appl. No.: 17/484,626

(22) Filed: Sep. 24, 2021

(65) Prior Publication Data

US 2022/0100414 A1 Mar. 31, 2022

Related U.S. Application Data

(63) Continuation of application No. PCT/CN2021/092516, filed on May 8, 2021.

(30) Foreign Application Priority Data

Sep. 30, 2020 (CN) .......................... 202011063236.1

(51) Int. Cl.
  *G06F 3/06* (2006.01)
(52) U.S. Cl.
  CPC .......... *G06F 3/0655* (2013.01); *G06F 3/0604* (2013.01); *G06F 3/0673* (2013.01)

(58) Field of Classification Search
None
See application file for complete search history.

(56) References Cited

U.S. PATENT DOCUMENTS

2020/0359914 A1* 11/2020 Zuckerman-Stark ...................... A61B 5/7267

* cited by examiner

*Primary Examiner* — Brian R Peugh
(74) *Attorney, Agent, or Firm* — Hodgson Russ LLP

(57) ABSTRACT

A data storage method includes: obtaining memory banks of arithmetic data; generating undetermined memory bank numbers of the memory banks sequentially; scanning storage dimensions of the arithmetic data to obtain the undetermined memory bank numbers, filling elements to make the undetermined memory bank numbers continuous if the undetermined memory bank numbers of two adjacent dimensions are not continuous; taking as a current transformation vector through a greedy algorithm a determined transformation vector where conflict is least and the number of the filling elements is smallest; generating current memory bank numbers of the memory banks according to the current transformation vector; converting each of the current memory bank numbers into a physical storage bank address through an offset function to obtain a corresponding internal offset address; and storing the arithmetic data into the memory banks according to the current memory bank numbers and the internal offset addresses.

10 Claims, 6 Drawing Sheets memory bank number

| 0 | 1 | 2 | 3 | 4 | 5 | 6 | 7 |
|---|---|---|---|---|---|---|---|
| 0 | 1 | 2 | 3 | 4 | 5 | 6 | 7 |
| 8 | 9 | 10 | 11 | 12 | 13 | 14 | 15 |
| 16 | 17 | 18 | 19 | 20 | 21 | 22 | 23 |
| 24 | 25 | 26 | 27 | 28 | 29 | 30 | 31 |
| 32 | 33 | *** | *** | | | | |

Fig. 3(a)

memory bank number

| 0 | 1 | 2 | 3 | 4 | 5 | 6 | 7 |
|---|---|---|---|---|---|---|---|
| 0 | 9 | 18 | 27 | 36 | 45 | 54 | 63 |
| 72 | -- | 1 | 10 | 19 | 28 | 37 | 46 |
| 55 | 64 | 73 | -- | 2 | 11 | 20 | 29 |
| 38 | 47 | 56 | 65 | 74 | -- | 3 | 12 |
| 21 | 30 | *** | *** | | | | |

Fig. 3(b)

memory bank number

| 0 | 1 | 2 | 3 | 4 | 5 | 6 | 7 |
|---|---|---|---|---|---|---|---|
| 0 | 1 | 2 | 3 | 4 | 5 | 6 | 7 |
| 8 | -- | 9 | 10 | 11 | 12 | 13 | 14 |
| 15 | 16 | 17 | -- | 18 | 19 | 20 | 21 |
| 22 | 23 | 24 | 25 | 26 | -- | 27 | 28 |
| 29 | 30 | *** | *** | | | | |

Fig. 3(c)

memory bank number

| | 0 | 1 | 2 | 3 | 4 | 5 | 6 | 7 |
|---|---|---|---|---|---|---|---|---|
| 0 | 0 | 1 | 2 | 3 | 4 | 5 | 6 | 7 |
| 1 | 8 | 9 | 10 | 11 | 12 | 13 | 14 | 15 |
| 2 | 16 | 17 | - | 18 | 19 | 20 | 21 | 22 |
| 3 | 23 | 24 | 25 | 26 | 27 | 28 | 29 | 30 |
| 4 | 31 | 32 | 33 | 34 | 35 | - | 36 | 37 |
| 5 | 38 | 39 | 40 | 41 | (42) | 43 | 44 | 45 |
| 6 | 46 | 47 | 48 | 49 | 50 | (51) | (52) | (53) |
| 7 | - | ... | ... | | | | | |
| 0 | (61) | 62 | 63 | 64 | 65 | 66 | 67 | 68 |
| 1 | 69 | 70 | 71 | - | 72 | 73 | 74 | 75 |
| 2 | 76 | 77 | 78 | 79 | 80 | 81 | 82 | 83 |
| 3 | 84 | 85 | 86 | 87 | 88 | 89 | - | 90 |
| 4 | 91 | 92 | 93 | 94 | 95 | 96 | 97 | 98 |
| 5 | 99 | 100 | 101 | 102 | 103 | 104 | 105 | 106 |
| 6 | 107 | - | ... | ... | | | | |
| 7 | | | | | | | | |

Fig. 8

DATA STORAGE AND READING METHOD AND DEVICE

CROSS-REFERENCE TO RELATED APPLICATION

This application is a continuation of International Application No. PCT/CN2021/092516, filed May 8, 2021, which is based on and claims priority to and benefits of Chinese Patent Application No. 202011063236.1, filed on Sep. 30, 2020, the entire contents of which are incorporated herein by reference.

FIELD

The present disclosure relates to the field of data storage and memory management, and more particularly to a data storage method and device.

BACKGROUND

As a promising choice for specific accelerators, the coarse-grained reconfigurable architecture (CGRA) has attracted more and more attention due to its high energy efficiency close to an application specific integrated circuit (ASIC) and higher software programmability. CGRA is usually composed of a host controller (usually being a central processing unit, CPU), a processing element (PE) array, a main memory and a local memory (usually having a multi-bank memory structure). As shown in FIG. 1, CGRA includes a host controller, a context memory, a data memory, a PEA shared memory (SM), a parallel-access data bus, a PEA global regfile, an output register, a local regfile, a context buffer, a multi-bank PEA shared memory, a multiplexer (MUX), an arithmetic and logic unit (ALU)/load and store unit (LSU), a global regfile (GR) and so on. An execution process of the CGRA computing system includes initializing CGRA instructions and input data by the host controller, and storing the CGRA instructions and the input data into the main memory.

Before CGRA accelerates applications, the input data is transferred from the main memory to the local memory, and the instructions are loaded into the configuration memory of CGRA. After CGRA completes computing, output data is transferred from the local memory to the main memory. In CGRA, for computation-intensive applications, the instructions are generally mapped into different computing units (also known as processing elements, PE) to execute computing processes in parallel. In order to meet requirements of parallel memory access, CGRA usually adopts a multi-bank memory architecture. In the multi-bank memory, each memory bank is provided with independent read and write ports, and single-cycle parallel memory access can be realized by distributing the data into different banks.

The high energy efficiency of CGRA is attributed to a large number of computing resources distributed on the computing array, the complex interconnection manner and different levels of storage systems. However, cooperation of these resources is necessary to achieve better performance and energy efficiency in application. If these resources are not scheduled and cooperated well, CGRA, as an accelerator, may decrease the performance of the system. In addition, since the hardware architecture of CGRA is very different from the popular general-purpose processors, an existing compilation technology for the general-purpose processors cannot be completely transplanted to CGRA. Therefore, it is of great necessity to research and develop the compilation technology of CGRA. Such compilation technology needs to dig out parallelism in the applications and reduce delay of data reading, and provide configuration information according to hardware architecture characteristics of CGRA, so as to achieve high performance and high energy efficiency.

In order to enable CGRA to effectively complete different types of computing tasks, it is necessary to generate corresponding target programs for the host controller and data path of CGRA. Therefore, a CGRA compiler needs to provide a controlling code running in a reconfigurable controller and configuration information corresponding to the data path. Since the hardware structure of CGRA is very different from the hardware structure of the general-purpose processors, the compilation technology and process of the CGRA compiler are also different from that of traditional compilers. The core work of the CGRA compiler is to analyze an application program and divide the program into a hardware executing code and a software running code, and then compile and process these two parts of codes to generate a controller running code and configuration information of a reconfigurable data path. As shown in FIG. 2, the compilation technology of the reconfigurable processor includes task dividing and scheduling, arithmetic mapping, memory mapping optimization, and so on. The technology provided in the present disclosure relates to the memory mapping optimization technology, which may directly affect running performance of the program, and thus has attached more attention.

The following code shows an example program, assuming that A is a 9×9 matrix.

```
for (int i=1; i<Row-1; i++)
    for (int j=1; j<Col-1; j++)
        access(A[i-1][j], A[i+1][j], A[i][j],
               A[i][j-1], A[i][j+1])
```

The program in this example consists of a two-dimensional nested loop, and each loop needs to access five elements in the array A. In order to streamline the loop, five elements will be accessed simultaneously in each clock cycle. Different strategies are used to obtain a new address space. Numbers in the figure indicate offset addresses of the elements.

Frist, an original array is copied directly to a target memory to obtain an address space as shown in FIG. 3(a). In this example, conflicts occur in each cycle, since for each iteration, A[i−1][j] and A[i][j−1] are located in the same banks as A[i+1][j] and A[i][j+1]), respectively. For example, in a first cycle, the program simultaneously accesses elements at addresses 1, 9, 10, 11, and 19, and because the elements at addresses 1 and 9 are located in the same bank, conflicts will occur at every cycle, which decreases the program performance seriously.

Then, an address space as shown in FIG. 3(b) will be generated by a linear transformation based (LTB) algorithm. Though conflicts in each cycle are avoided, additional data preprocessing is required due to the discontinuity of the data. Moreover, this strategy assumes that the data can be completely placed into the target memory, which is not conducive to the subtask division.

SUMMARY

The present disclosure provides in embodiments a data storage method, which is used for a plurality of memory banks in a coarse-grained reconfigurable architecture (CGRA) chip. An access mode of the plurality of the memory banks includes a disengaged mode and an engaged mode. The plurality of the memory banks store arithmetic data with a preset storage bit number.

The data storage method includes:

scanning a plurality of storage dimensions of the arithmetic data according to the preset storage bit number, and matching memory banks in the disengaged mode to obtain a plurality of the memory banks of the arithmetic data;

scanning the plurality of the memory banks according to a determined transformation vector sequentially, and generating undetermined memory bank numbers of the plurality of the memory banks sequentially, in which a dimension of the determined transformation vector corresponds to the storage dimension of the arithmetic data;

scanning the storage dimension of the arithmetic data in a determined sequence to obtain the undetermined memory bank numbers, and filling elements to make the undetermined memory bank numbers continuous if the undetermined memory bank numbers of two adjacent dimensions are not continuous;

taking as a current transformation vector through a greedy algorithm the determined transformation vector where conflict is least and the number of the filling elements is smallest;

generating a plurality of current memory bank numbers of the plurality of the memory banks according to the current transformation vector;

converting each of the current memory bank numbers into a physical storage bank address corresponding to the current memory bank number through an offset function to obtain a corresponding internal offset address; and storing the arithmetic data into the plurality of the memory banks according to the plurality of the current memory bank numbers and the plurality of the internal offset addresses.

In some embodiments, scanning the plurality of the memory banks according to the determined transformation vector sequentially, and generating undetermined memory bank numbers of the plurality of the memory banks sequentially includes:

setting the determined transformation vector $\alpha=(\alpha 0, \alpha 1, \ldots, \alpha(d-1))$;

scanning the plurality of the memory banks sequentially; and generating the undetermined memory bank numbers of the plurality of the memory banks according to the following formula:

$$B(x)=(\alpha \cdot x) \% N$$

where N is a bit number of a physical memory row of any memory bank of the plurality of the memory banks, and x is a physical address number of the any memory bank.

In some embodiments, scanning the storage dimension of the arithmetic data in the determined sequence to obtain the undetermined memory bank numbers, and filling elements to make the undetermined memory bank numbers continuous if the undetermined memory bank numbers of two adjacent dimensions are not continuous includes:

obtaining one or more discontinuous positions in the plurality of the undetermined memory bank numbers; and filling the elements in the one or more discontinuous positions to make the undetermined memory bank numbers continuous if the dimensions corresponding to the one or more discontinuous positions are adjacent.

In some embodiments, taking as the current transformation vector through the greedy algorithm the determined transformation vector where conflict is the least and the number of the filling elements is smallest includes:

setting an initial cycle start interval AII=0, Nb=N, where N is the memory bank number of any of the plurality of the memory banks;

obtaining a plurality of the determined transformation vectors without filling the memory bank numbers as an intermediate transformation vector $\alpha$; and determining whether an optimal intermediate transformation vector by minimizing a filling overhead function Padding($\alpha$) exists according to the intermediate transformation vector $\alpha$ in the case of no conflict constraints, where $\forall 0 \leq i < d, 0 \leq \alpha i < N$;

if the optimal intermediate transformation vector exists, outputting the intermediate transformation vector $\alpha$ as the current transformation vector;

if the optimal intermediate transformation vector does not exist, setting AII=AII+1, Nb=Nb+N, and repeating computing until the current transformation vector is obtained.

In some embodiments, the data storage method further includes:

setting a reading window covering a determined number of the memory banks; and sliding the reading window along a sequence of the memory banks according to a determined sliding distance, and reading as current read data memory data of the plurality of the memory banks covered by the reading window at an initial position and memory data of the plurality of the memory banks covered by the reading window after the reading window slides.

The present disclosure provides in embodiments a data storage device, which is used for a plurality of memory banks in a coarse-grained reconfigurable chip. An access mode of the plurality of the memory banks includes a disengaged mode and an engaged mode, and the plurality of the memory banks store arithmetic data with a preset storage bit number.

The data storage device includes:

a scanner, configured to scan a plurality of storage dimensions of the arithmetic data according to the preset storage bit number, and match memory banks in the disengaged mode to obtain a current memory bank of the arithmetic data;

a generator, configured to scan the plurality of the memory banks according to a determined transformation vector sequentially, and generate undetermined memory bank numbers of the plurality of the memory banks sequentially, in which a dimension of the determined transformation vector corresponds to the storage dimension of the arithmetic data;

a filler, configured to scan the storage dimension of the arithmetic data in a determined sequence to obtain the undetermined memory bank numbers, and fill elements to make the undetermined memory bank numbers continuous if the undetermined memory bank numbers of two adjacent dimensions are not continuous;

an acquirer, configured to take as a current transformation vector through a greedy algorithm the determined transformation vector where conflict is least and the number of the filling elements is smallest, the generator being further configured to generate a current memory bank number of the current memory bank according to the current transformation vector, and the acquirer being further configured to convert the current memory bank number into a physical storage bank address corresponding to the current memory bank number through an offset function to obtain a corresponding internal offset address; and a memory, configured to store the arithmetic data into the plurality of the memory banks according to the current memory bank numbers and the internal offset addresses.

In some embodiments, the generator is configured to set the determined transformation vector α=(α0, α1, . . . , α(d−1)), scan the plurality of the memory banks sequentially, and generate the undetermined memory bank numbers of the plurality of the memory banks according to the following formula:

$$B(x)=(\alpha \cdot x)\% N$$

where N is a bit number of a physical memory row of any memory bank of the plurality of the memory banks, and x is a physical address number of the any memory bank.

In some embodiments, the filler is further configured to obtain one or more discontinuous positions in the plurality of the undetermined memory bank numbers, and fill the elements in the one or more discontinuous positions to make the undetermined memory bank numbers continuous if the dimensions corresponding to the one or more discontinuous positions are adjacent.

In some embodiments, the acquirer is further configured to:

set an initial cycle start interval AII=0, Nb=N, where N is the memory bank number of any of the plurality of the memory banks;

obtain a plurality of the determined transformation vectors without filling the memory bank numbers as an intermediate transformation vector α; and determine whether an optimal intermediate transformation vector by minimizing a filling overhead function Padding(α) exists according to the intermediate transformation vector α in the case of no conflict constraints, where ∀0≤i<d, 0≤αi<N;

if the optimal intermediate transformation vector exists, output the intermediate transformation vector α as the current transformation vector;

if the optimal intermediate transformation vector does not exist, set AII=AII+1, Nb=Nb+N, and repeat computing until the current transformation vector is obtained.

In some embodiments, the data storage device further includes a reader. The reader is configured to:

set a reading window covering a determined number of the memory banks; and slide the reading window along a sequence of the memory banks according to a determined sliding distance, and read as current read data memory data of the plurality of the memory banks covered by the reading window at an initial position and memory data of the plurality of the memory banks covered by the reading window after the reading window slides.

Characteristics, technical features, advantages and implementations of the data storage method used for a multi-bank memory according to the present disclosure will be further described hereinafter in a clear and understandable way with reference to the accompanying drawings.

BRIEF DESCRIPTION OF THE DRAWINGS

FIG. 3(*a*) is a schematic diagram illustrating memory division in the prior art.

FIG. 3(*b*) is another schematic diagram illustrating memory division in the prior art.

FIG. 3(*c*) is a schematic diagram illustrating memory division in the present disclosure.

FIG. 8 is a schematic diagram for illustrating subtask division of a data storage method for a multi-bank memory in an embodiment of the present disclosure.

DETAILED DESCRIPTION

Figure 1:
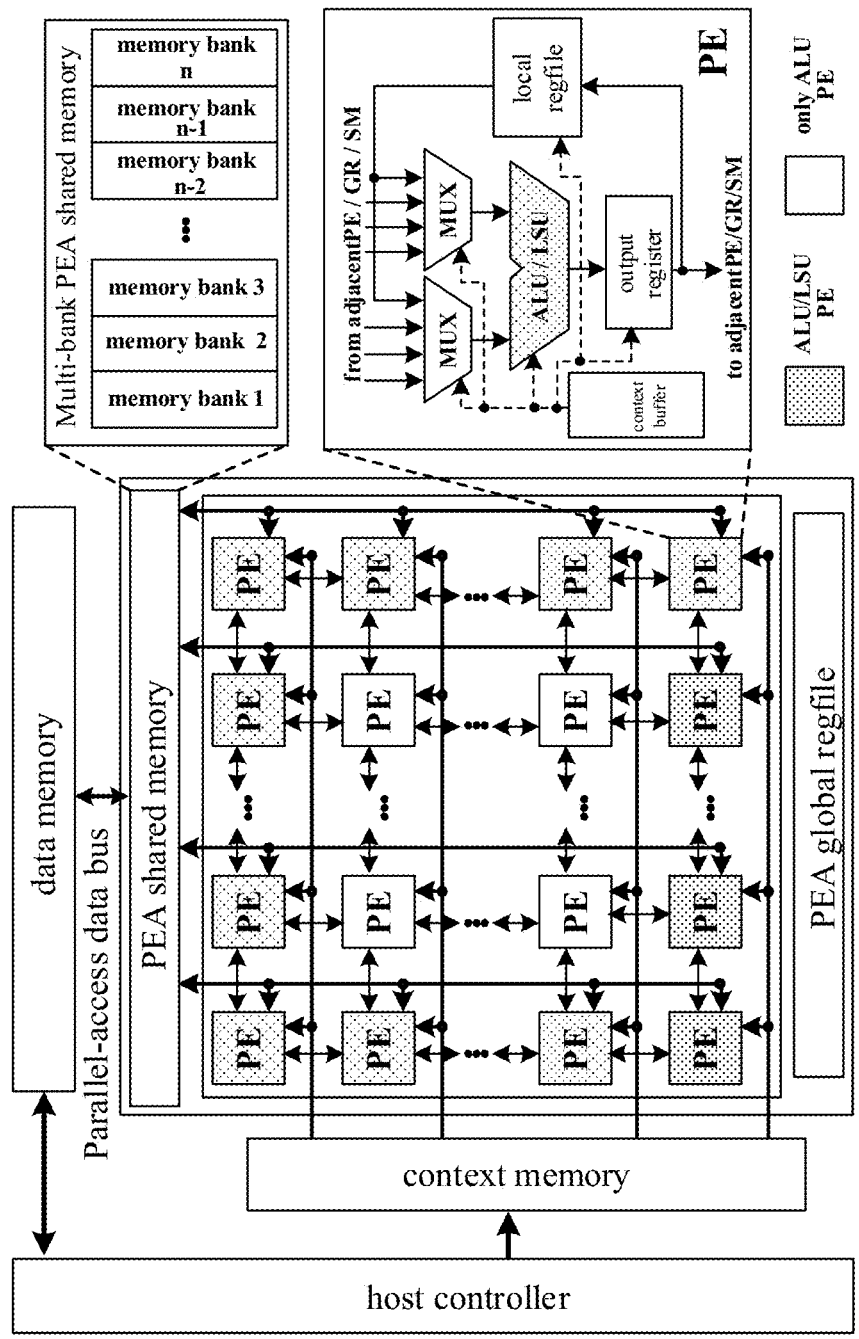
FIG. 1 is a schematic diagram illustrating an architecture of CGRA system in the prior art.
Figure 2:
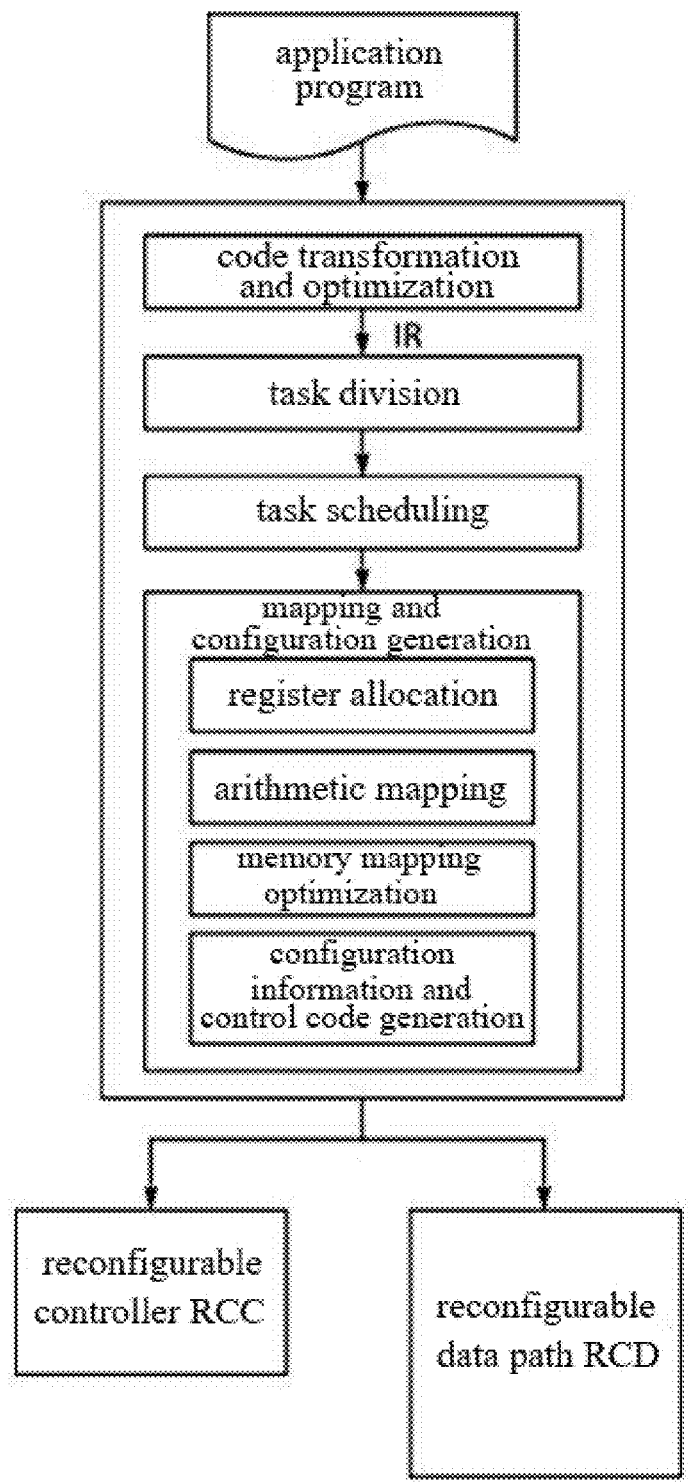
FIG. 2 is a schematic diagram illustrating a compilation system framework of CGRA in the prior art.

For a clearer understanding of the technical characteristics, objectives and effects of the present disclosure, some specific embodiments of the present disclosure will now be illustrated below with reference to the accompanying drawings, in which the same or similar elements and elements having same or similar functions are denoted by like reference numerals.

It is to be understood that the expression "exemplary" used herein means the related embodiments serve as "examples or explanations", and any exemplary figure and embodiment described herein cannot be construed as a preferred implementation or a more advantageous implementation. To make the drawings concise, only parts related to the exemplary embodiments are schematically shown in the drawings, and they do not represent actual structures and true proportions of products.

A first object of the present disclosure is to provide a data storage method, which is capable of dispersing elements into different memory banks in an appropriate way by linear transformation, and dividing an application into a plurality of small tasks by subtask division, which significantly reduces the requirements of the application for memory resources.

A second object of the present disclosure is to provide a data reading method, which improves the data reading efficiency by subtask division.

A third object of the present disclosure is to provide a data storage device, which reduces memory requirements and saves system costs.

In order to avoid the overhead of data preprocessing and reduce memory requirements, an object of the method in the present disclosure is to provide a strategy that is able to generate an approximately continuous address space and optimize the CGRA computing efficiency. The address space obtained by the method of the present disclosure is as shown in FIG. 3(*c*). Some filling elements are regularly added to an original array, which may eliminate conflicts in existing schemes. Since the new address space generated by the method of the present disclosure is approximately continuous, there is no need for data preprocessing, and it is also conducive to subtask division.

In the present disclosure, the terms "memory bank" and "storage bank" may be used interchangeably.

The present disclosure provides in embodiments a data storage method for a multi-bank memory. The multi-bank memory has a plurality of memory banks in a coarse-grained reconfigurable architecture (CGRA) chip. An access mode of the plurality of the memory banks includes a disengaged mode and an engaged mode. The data storage method for the multi-bank memory may store arithmetic data with a preset storage bit number. The arithmetic data are data that is to be computed and transferred from outside of CGRA to inside of CGRA.

Figure 4:
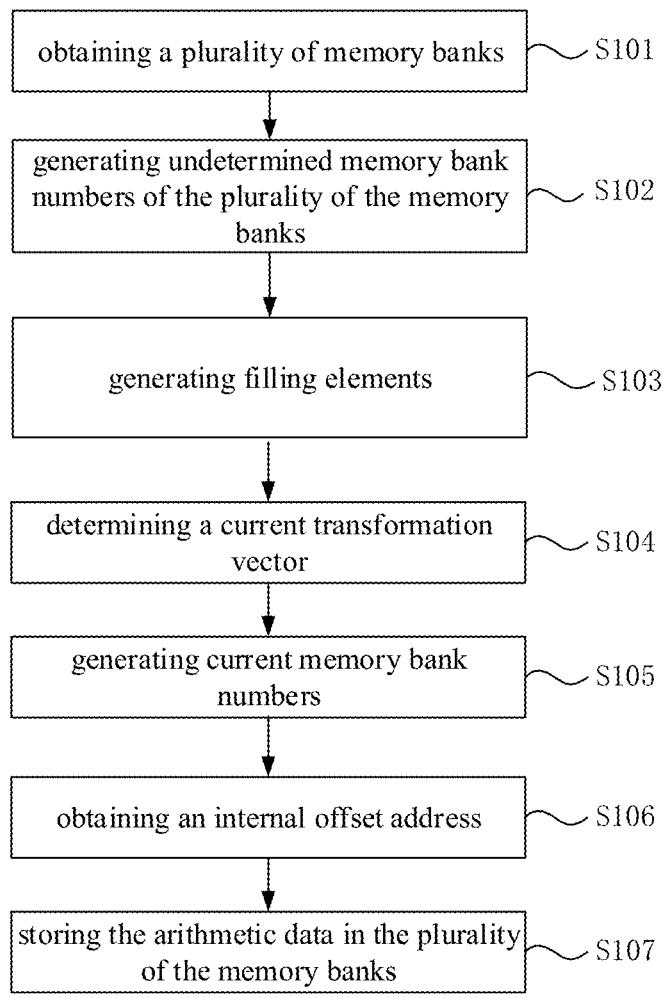
FIG. 4 is a schematic flowchart illustrating a data storage method for a multi-bank memory in an embodiment of the present disclosure.

FIG. 4 illustrates the data storage method used for the plurality of the memory banks in the coarse-grained reconfigurable chip according to embodiments of the present disclosure.

As shown in FIG. 4, the data storage method includes steps of S101 to S107.

In the step S101, a plurality of the memory banks is obtained.

For example, a plurality of storage dimensions of the arithmetic data are scanned according to the preset storage bit number, and memory banks in the disengaged mode are matched to obtain the plurality of the memory banks of the arithmetic data. Specifically, for the arithmetic data of the plurality of the storage dimensions, the arithmetic data of each storage dimension is matched with the memory bank in the disengaged mode according to the preset storage bit number to obtain the plurality of the memory banks corresponding to the arithmetic data.

The plurality of the storage dimensions of the arithmetic data may be understood as follows. For example, one-dimensional data refers to sequence data, two-dimensional data refers to matrix data, and three-dimensional data refers to storage data like color. Therefore, the storage space or memory space occupied by the arithmetic data with different dimensions is different, and requirements of the arithmetic data with different dimensions for the memory space are also different.

In the step S102, undetermined memory bank numbers of the plurality of the memory banks are generated.

For example, the plurality of the memory banks are scanned according to a determined transformation vector sequentially, and the undetermined memory bank numbers of the plurality of the memory banks are generated sequentially. A dimension of the determined transformation vector corresponds to the storage dimension of the arithmetic data.

In the step S103, filling elements are generated.

For example, the undetermined memory bank numbers corresponding to the storage dimensions of the arithmetic data are determined in a determined sequence, and the elements are filled between two undetermined memory bank numbers to make the undetermined memory bank numbers continuous if the undetermined memory bank numbers corresponding to two adjacent storage dimensions are not continuous.

In the step S104, a current transformation vector is obtained.

For example, the determined transformation vector where conflict is least and the number of the filling elements is smallest is taken as the current transformation vector through a greedy algorithm. A dimension of the current transformation vector is the same as the storage dimension of the arithmetic data.

In the step S105, current memory bank numbers are generated.

For example, a plurality of the current memory bank numbers of the plurality of the memory banks are generated according to the current transformation vector.

In the step S106, an internal offset address is obtained.

For example, each of the current memory bank numbers is converted into a physical storage bank address corresponding to the current memory bank number through an offset function F(x) to obtain a corresponding internal offset address.

In the step S107, the arithmetic data is stored in the memory banks.

For example, the arithmetic data is stored into the plurality of the memory banks according to the plurality of the current memory bank numbers and the plurality of the internal offset addresses.

In an embodiment of the present disclosure, the step S102 includes: scanning the plurality of the memory banks sequentially according to the determined transformation vector $\alpha=(\alpha 0, \alpha 1, \ldots, \alpha(d-1))$, and generating the undetermined memory bank numbers B(x) of the plurality of the memory banks according to the following formula (1):

$$B(x)=(\alpha \cdot x) \% N \quad \text{formula (1)},$$

where the symbol "·" indicates a vector dot-product, N is a bit number of a physical memory row of any memory bank of the plurality of the memory banks, and x is a physical address number of the any memory bank.

Figure 5:
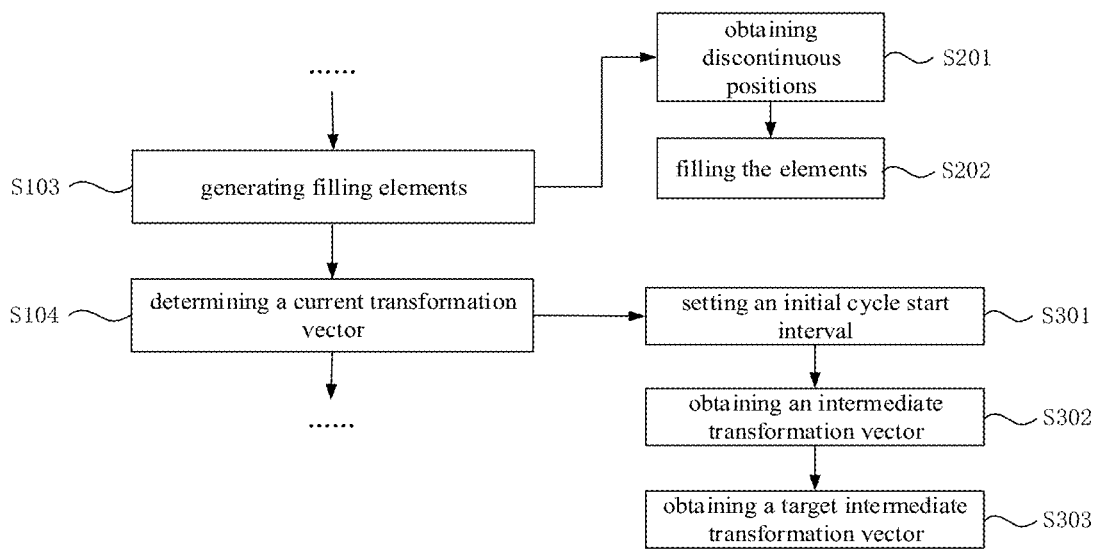
FIG. 5 is a schematic flowchart illustrating a data storage method for a multi-bank memory in an embodiment of the present disclosure.

In an embodiment of the present disclosure, as shown in FIG. 5, the step S103 further includes steps of S201 and S202.

In the step S201, discontinuous position(s) is/are obtained.

For example, one or more discontinuous positions in the plurality of the undetermined memory bank numbers are obtained.

In the step S202, the elements are filled.

For example, if the storage dimensions corresponding to the one or more discontinuous positions are adjacent, the elements are filled in the one or more discontinuous positions to make the undetermined memory bank numbers continuous.

In an embodiment of the present disclosure, as shown in FIG. 5, the step S104 further includes steps of S301 to S303.

In the step S301, an initial cycle start interval is set.

For example, the initial cycle start interval is set as AII=0, Nb=N, where N is the memory bank number of any of the plurality of the memory banks, and Nb is an intermediate variable.

In the step S302, an intermediate transformation vector is obtained.

For example, a plurality of the determined transformation vectors without filling the memory bank numbers are obtained as the intermediate transformation vector α.

In the step S303, a target intermediate transformation vector is obtained.

For example, it is determined whether the target intermediate transformation vector by minimizing a filling overhead function Padding(α) exists according to the intermediate transformation vector α in the case of no conflict constraints, where $\forall 0 \leq i<d$, and $0 \leq \alpha i<N$. If the target intermediate transformation vector exists, the target intermediate transformation vector is outputted as the current transformation vector. If the target intermediate transformation vector does not exist, the cycle start interval is set as AII=AII+1, Nb=Nb+N to return to the step S303 to repeat computing until the current transformation vector is obtained.

The present disclosure provides in embodiments a data reading method for a multi-bank memory, which includes the data storage method for the multi-bank memory as described in the above embodiments.

The data reading method for the multi-bank memory further includes: setting a reading window covering a determined number of the memory banks. The reading window is slid along a sequence of the memory banks according to a determined sliding distance, and memory data of the plurality of the memory banks covered by the reading window at an initial position and memory data of the plurality of the memory banks covered by the reading window after the reading window slides are read as current read data.

The present disclosure provides in embodiments a data storage device for a multi-bank memory. The multi-bank memory has a plurality of memory banks in a coarse-grained reconfigurable architecture (CGRA) chip. An access mode of the plurality of the memory banks includes a disengaged mode and an engaged mode. The data storage device for the multi-bank memory may store arithmetic data with a preset storage bit number.

Specifically, the data storage device for the multi-bank memory includes a scanner, a generator, a filler, an acquirer and a memory. The generator includes a first generator and a second generator, and the acquirer includes a first acquirer and a second acquirer.

Figure 6:
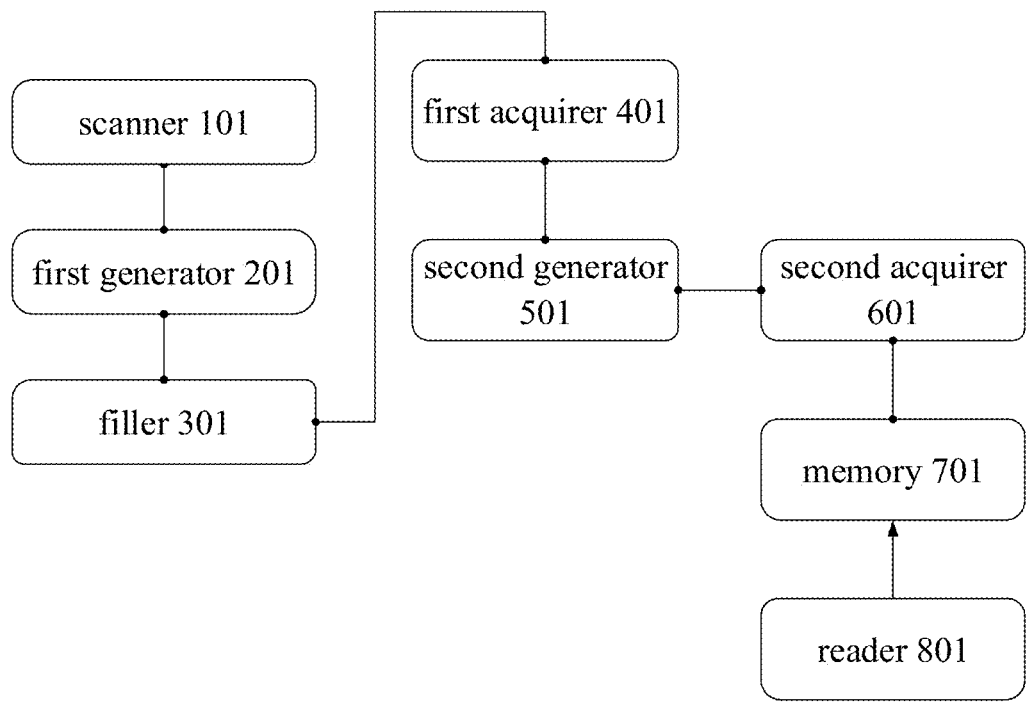
FIG. 6 is a schematic block diagram illustrating a data storage device for a multi-bank memory in an embodiment of the present disclosure.

As shown in FIG. 6, the data storage device may include the scanner 101, the first generator 201, the filler 301, the first acquirer 401, the second generator 501, the second acquirer 601 and the memory 701.

The scanner 101 is configured to scan a plurality of storage dimensions of the arithmetic data according to the preset storage bit number, and match memory banks in the disengaged mode to obtain a plurality of memory banks of the arithmetic data. Specifically, for the arithmetic data of the plurality of the storage dimensions, the scanner 101 is configured to match the arithmetic data of each storage dimension with the memory bank in the disengaged mode according to the preset storage bit number to obtain the plurality of the memory banks corresponding to the arithmetic data.

The first generator 201 is configured to scan the plurality of the memory banks according to a determined transformation vector sequentially, and generate undetermined memory bank numbers of the plurality of the memory banks sequentially. A dimension of the determined transformation vector corresponds to the storage dimension of the arithmetic data.

The filler 301 is configured to determine the undetermined memory bank numbers corresponding to the storage dimensions of the arithmetic data in a determined sequence, and fill elements between two undetermined memory bank numbers to make the undetermined memory bank numbers continuous if the undetermined memory bank numbers corresponding to two adjacent storage dimensions are not continuous.

The first acquirer 401 is configured to take the determined transformation vector where conflict is least and the number of the filling elements is smallest as a current transformation vector through a greedy algorithm.

The second generator 501 is configured to generate a plurality of current memory bank numbers of the plurality of the current memory banks according to the current transformation vector.

The second acquirer 601 is configured to convert each of the current memory bank numbers into a physical storage bank address corresponding to the current memory bank number through an offset function F(x) to obtain a corresponding internal offset address.

The memory 701 is configured to store the arithmetic data into the plurality of the memory banks according to the plurality of the current memory bank numbers and the plurality of the internal offset addresses.

In an embodiment of the present disclosure, the first generator 201 is further configured to: scan the plurality of the memory banks sequentially according to the determined transformation vector $\alpha=(\alpha 0, \alpha 1, \ldots, \alpha(d-1))$, and generate the undetermined memory bank numbers B(x) of the plurality of the memory banks according to the following formula:

$$B(x)=(\alpha \cdot x) \% N,$$

where N is a bit number of a physical memory row of any memory bank of the plurality of the memory banks, and x is a physical address number of the any memory bank.

In an embodiment of the present disclosure, the filler 301 is further configured to obtain one or more discontinuous positions in the plurality of the undetermined memory bank numbers, and fill the elements in the one or more discontinuous positions to make the undetermined memory bank numbers continuous if the storage dimensions corresponding to the one or more discontinuous positions are adjacent.

In an embodiment of the present disclosure, the first acquirer 401 is further configured to set an initial cycle start interval AII=0, Nb=N, where N is the memory bank number of any of the plurality of the memory banks; obtain a plurality of the determined transformation vectors without filling the memory bank numbers as an intermediate transformation vector $\alpha$; and determine whether an target intermediate transformation vector by minimizing a filling overhead function Padding($\alpha$) exists according to the intermediate transformation vector $\alpha$ in the case of no conflict constraints, where $\forall 0 \leq i < d$, $0 \leq \alpha i < N$; if the target intermediate transformation vector exists, output the target intermediate transformation vector $\alpha$ as the current transformation vector; if the target intermediate transformation vector does not exist, set AII=AII+1, Nb=Nb+N to return to the acquirer 401 to execute the acquisition step again until the current transformation vector is obtained.

In an embodiment of the present disclosure, as shown in FIG. 6, the data storage device further includes a reader 801.

The reader 801 is configured to set a reading window covering a determined number of the memory banks, and slide the reading window along a sequence of the memory banks according to a determined sliding distance, and read as current read data memory data of the plurality of the memory banks covered by the reading window at an initial position and memory data of the plurality of the memory banks covered by the reading window after the reading window slides.

According to embodiments of the present disclosure, the multi-bank memory dividing process for CGRA includes an address mapping process and a subtask generation process. In the address mapping process, an original array is mapped to a new address space (i.e., a target memory address space) by constructing the bank function B(x) and the internal offset function F(x). In the subtask generation process, a kernel is divided into different subtasks, so as to make the computing on CGRA feasible when the memory is insufficient.

When address mapping is performed using a method based on the linear transformation, in order to map a d-dimensional address $x=(x0, x1, \ldots, x(d-1))$ to new locations in N banks of the physical memory, the transformation vector $\alpha=(\alpha 0, \alpha 1, \ldots, \alpha(d-1))$ needs to be determined, and then the memory bank number is determined by the following formula: $B(x)=(\alpha \cdot x) \% N$.

According to the method provided in the present disclosure, the scanning sequence is first determined, which may determine the data arrangement in the new address space. Then, the transformation vector $\alpha$ that minimizes the filling overhead is searched to determine the storage function. After the transformation vector α is obtained, in combination with the subtask division method based on the sliding window, an overall memory dividing scheme is obtained.

In an example, the data storage method provided in the present disclosure includes the following contents.

I. Scanning Sequence

The method provided in the present disclosure adopts a memory filling method designed for an address mapping manner based on the linear transformation to determine the internal offset function F(x). In order to generate a new address, the memory filling method scans each dimension in a determined sequence to obtain the undetermined memory bank number. If the undetermined memory bank numbers of two adjacent storage dimensions are not continuous, the corresponding filling elements are filled to the undetermined memory bank numbers to allow the computation of the new address meet the rule.

Figure 7:
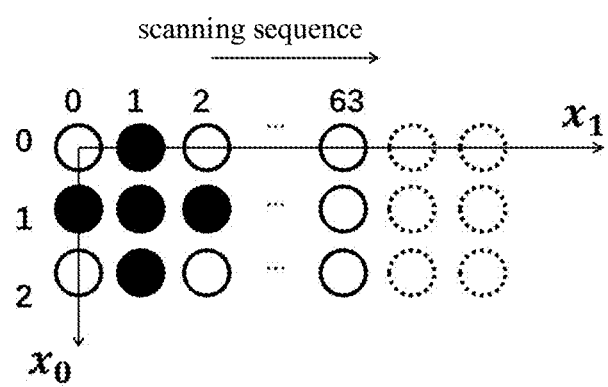
FIG. 7 is a schematic diagram for illustrating filling elements in a data storage method for a multi-bank memory in an embodiment of the present disclosure.

As shown in FIG. 7, when a memory row includes 8 storage elements, B(x)=(2*0+x1)%8 (i.e., B(x)=(2*x0+1*x1)%8) indicates a memory filling example, where α=(2, 1), and x=(x1, x2). It is obtained according to the above-mentioned formula that a bank number of the last element in a current row (such as the first row) is 7 (that is, 7=(2*0+63)%8, where α=(2, 1), x=(0, 63)), and a bank number of the first element in the next row (i.e., the second row) is 2 (that is, 2=(2*1+0)%8, where α=(2, 1), x=(1, 0)). Thus, two filling elements need to be filled (for example, the filling elements are added to the memory banks with the bank numbers being 0 and 1, respectively) so as to generate a new address space.

In this internal offset generating process, there are at most (d!) kinds of possible address arrangements for the same transformation vector α according to different scanning sequence (such as a reverse sequence).

As mentioned above, in order to reduce the total amount of data transmitted and improve the transmission efficiency, data should be placed continuously in the new address space. The scanning sequence of the algorithm is sequential, which is the same as the original storage sequence. Once the scanning sequence is determined, the form of the internal offset function F(x) and the data arrangement are determined. The geometric meaning of the strategy is to avoid memory conflicts by regularly adding the filling elements based on the original array. The specific internal offset computing process will be given below.

II. Memory Bank Mapping Function

According to the present disclosure, a transformation vector α that minimizes the cycle start interval AII and the filling element overhead may be obtained. In order to reduce the AII, a non-conflict constraint is used. On the basis of this constraint, a candidate linear transformation vector that meets the requirements may be found based on the plurality of the memory bank number sequences generated. Given m different memory accesses x(0), x(1), . . . , x(m−1), the non-conflict bank mapping function should satisfy: $\forall 0 \leq i < j \leq m-1$, $B(x(i)) \neq B(x(j))$.

After obtaining a set of candidate linear transformation vectors meeting the non-conflict conditions, it is necessary to find the transformation vector with the smallest filling overhead. Assume that α(f) is the transformation vector without any filling processing on the original array, so there is no filling overhead. For the storage dimension i, the increment of each α(f) in the storage dimension i means adding a filling element between the storage dimensions i and (i+1). The concept of filling vector is introduced, q=(q0, q1, . . . , q(d−1)), where qi represents an increment in a size of the storage dimension i (the $i^{th}$ dimension): $q_i = (\alpha_i - \alpha(f)_i) \% N$.

After the filling vector is introduced, an inner product of the filling vector and the storage dimension of the arithmetic data is computed to obtain a total filling overhead. Finally, if a non-conflict solution of K×N memory banks is finally obtained, it is clear that all data elements can be obtained without conflict by accessing N memory banks K times at most. For example, for a given memory bank number N, the framework of the algorithm is described as follows:

1. The cycle start interval AII=0, Nb=N is initialized.
2. The transformation vector α(f) without filling the memory bank number is obtained.
3. All possible transformation vectors α are obtained, where $\forall 0 \leq i < d$, $0 \leq \alpha_i < N$, and the target transformation vector which minimizes the filling overhead function Padding(α) in the case of no conflict constraints is searched.
4. If the target transformation vector is not found, AII=AII+1 and Nb=Nb+N are set, and all possible transformation vectors α are re-obtained, and the target transformation vector which minimizes the filling overhead function Padding(α) in the case of no non-conflict constraints is searched.

III. Computing an Internal Offset

After the bank function B(x) is generated, the offset function F(x) needs to be found to convert the address x into the internal offset of the corresponding memory bank. It is assumed that the scanning sequence is the same as the original arrangement sequence, and the memory adopts a linear address space, the d-dimensional data needs to be linearized and then stored in the storage system. It is assumed that: W=(w0, w1, . . . , w(d−1), 1), where wi represents a width of the array in the $i^{th}$ dimension, and the width refers to the number of data along the dimension, for example, for a 4*8 matrix, the width of 0 dimension is 4, and the width of 1 dimension is 8, vector coordinates may be linearized to a scalar x, without loss of generality, as shown in formula (2).

$$x = \sum_{i=0}^{d-1} \left( x_i \times \prod_{j=i+1}^{d-1} w_j \right) \quad \text{formula (2)}$$

Considering the linearization of the address space after adding the filling elements, the width of each storage dimension will change after adding the filling elements. The filling size Pi in the $i^{th}$ dimension may be determined by the following formula (3):

$$P_i = \sum_{j=i+1}^{d-2} \left( q_j \times \prod_{k=i+2}^{j+1} (w_k - 1) \right). \quad \text{formula (3)}$$

Thus, the address after filling blank elements may be determined by the following formula (4):

$$\text{Address}(\vec{x}) = \sum_{i=0}^{d-1}\left(x_i \times \left(\prod_{j=i+1}^{d-1} W_j + P_i\right)\right). \quad \text{formula (4)}$$

The internal offset function may be determined as:

$$F(\vec{x}) = \left\lfloor \frac{\text{Address}(\vec{x})}{N} \right\rfloor.$$

IV. Subtask Division

An intuitive way to divide the kernel is to make each subtask contain as many iteration vectors as possible until the data size exceeds the memory size, which, however, will cause several problems as follows. Firstly, there may be some overlapping data between subtasks, and repeat transmission of the data will cause additional overhead. Secondly, the address needs to be recomputed, which will cause additional computational overhead. Finally, randomly splitting the original array may introduce additional initialization overhead of direct memory access (DMA). In view of this, the method based on the sliding window is provided.

FIG. 8 illustrates the method based on the sliding window according to an embodiment of the present disclosure. For example, the target memory is composed of 8 memory banks, and the maximum depth is 8.

According to the method provided in the present disclosure, an 8*8 sliding window (as shown by the dashed box) is initialized at a beginning position of the new address space. The first subtask consists of the window and the corresponding iteration vector. The first iteration that accesses elements outside the sliding window is determined, and then the window is moved down as far as possible, while ensuring that the window contains all the elements accessed by the iteration. In this way, the second subtask (as shown by the solid line box) is obtained, and so on.

It should be noted that there is an overlapping part between two adjacent subtasks. When switching subtasks, only the non-overlapping part of the data needs to be transferred, and the overlapping part of the data does not need to be transferred. After all subtasks are executed, the obtained results should be consistent with the results of original task.

The method and device according to embodiments of the present disclosure may provide the following advantageous effects.

The algorithm is simple and easy to implement. The core validation part is a mathematical formula, and the overall algorithm is the greedy algorithm, which are easy to understand and easy to implement.

The memory access conflicts are effectively reduced. The memory division scheme obtained by the linear transformation process may effectively avoid conflicts.

There is no data preprocessing overhead. By limiting the scanning sequence, an approximately continuous address space is obtained, and the obtained data has good locality, and thus additional preprocessing steps are not needed.

The memory requirements of the application may be greatly reduced. By the subtask dividing manner bases on the sliding window, the application is divided into smaller subtasks, which greatly reduces the memory resources needed for executing the subtasks as compared with that for executing the complete application.

It should be understood that although the present disclosure is described with reference to the above embodiments, not every embodiment only includes an independent technical solution. The description manner of the specification is only for clarity and ease of understanding, those skilled in the art should regard the specification as a whole, and embodiments or the technical features described therein can also be appropriately combined to form other embodiments that can be understood by those skilled in the art.

The above detailed descriptions are only directed to some implementations of the present disclosure, which are explanatory and illustrative, and cannot be construed to limit the present disclosure, and it would be appreciated by those skilled in the art that changes, alternatives, and modifications can be made in the embodiments without departing from spirit and principles of the present disclosure, which also falls within the scope of the present disclosure.

What is claimed is:

1. A data storage method, used for a plurality of memory banks in a coarse-grained reconfigurable chip, wherein an access mode of the plurality of memory banks comprises a disengaged mode and an engaged mode, and the plurality of memory banks store arithmetic data with a preset storage bit number, wherein the data storage method comprises:
scanning a plurality of storage dimensions of the arithmetic data according to the preset storage bit number, and matching memory banks in the disengaged mode to obtain a plurality of the memory banks of the arithmetic data;
scanning the plurality of the memory banks according to a determined transformation vector sequentially, and generating undetermined memory bank numbers of the plurality of the memory banks sequentially, wherein a dimension of the determined transformation vector corresponds to the storage dimension of the arithmetic data;
scanning the storage dimension of the arithmetic data in a determined sequence to obtain the undetermined memory bank numbers, and filling elements to make the undetermined memory bank numbers continuous if the undetermined memory bank numbers of two adjacent dimensions are not continuous;
taking as a current transformation vector through a greedy algorithm the determined transformation vector where conflict is least and the number of the filling elements is smallest;
generating a plurality of current memory bank numbers of the plurality of memory banks according to the current transformation vector;
converting each of the current memory bank numbers into a physical storage bank address corresponding to the current memory bank number through an offset function to obtain a corresponding internal offset address; and
storing the arithmetic data into the plurality of memory banks according to the plurality of the current memory bank numbers and the plurality of the internal offset addresses.

2. The data storage method according to claim 1, wherein scanning the plurality of memory banks according to the determined transformation vector sequentially, and generating undetermined memory bank numbers of the plurality of memory banks sequentially comprises:

setting the determined transformation vector $\alpha=(\alpha 0, \alpha 1, \ldots, \alpha(d-1))$;

scanning the plurality of memory banks sequentially; and generating the undetermined memory bank numbers of the plurality of memory banks according to the following formula:

$$B(x)=(\alpha \cdot x) \% N$$

where N is a bit number of a physical memory row of any memory bank of the plurality of memory banks, and x is a physical address number of the any memory bank.

3. The data storage method according to claim 1, wherein scanning the storage dimension of the arithmetic data in the determined sequence to obtain the undetermined memory bank numbers, and filling elements to make the undetermined memory bank numbers continuous if the undetermined memory bank numbers of two adjacent dimensions are not continuous comprises:

obtaining one or more discontinuous positions in the plurality of the undetermined memory bank numbers; and filling the elements in the one or more discontinuous positions to make the undetermined memory bank numbers continuous if the dimensions corresponding to the one or more discontinuous positions are adjacent.

4. The data storage method according to claim 1, wherein taking as the current transformation vector through the greedy algorithm the determined transformation vector where conflict is the least and the number of the filling elements is smallest comprises:

setting an initial cycle start interval AII=0, Nb=N, where N is the memory bank number of any of the plurality of memory banks;

obtaining a plurality of the determined transformation vectors without filling the memory bank numbers as an intermediate transformation vector $\alpha$;

determining whether an optimal intermediate transformation vector by minimizing a filling overhead function Padding($\alpha$) exists according to the intermediate transformation vector $\alpha$ in the case of no conflict constraints, where $\forall 0 \leq i < d$, $0 \leq \alpha i < N$;

if the optimal intermediate transformation vector exists, outputting the intermediate transformation vector $\alpha$ as the current transformation vector; and if the optimal intermediate transformation vector does not exist, setting AII=AII+1, Nb=Nb+N, and repeating computing until the current transformation vector is obtained.

5. The data storage method according to claim 1, further comprising:

setting a reading window covering a determined number of the memory banks; and sliding the reading window along a sequence of the memory banks according to a determined sliding distance, and reading as current read data memory data of the plurality of memory banks covered by the reading window at an initial position and memory data of the plurality of memory banks covered by the reading window after the reading window slides.

6. A data storage device, used for a plurality of memory banks in a coarse-grained reconfigurable chip, wherein an access mode of the plurality of memory banks comprises a disengaged mode and an engaged mode, and the plurality of memory banks store arithmetic data with a preset storage bit number;

the data storage device comprises:

a scanner, configured to scan a plurality of storage dimensions of the arithmetic data according to the preset storage bit number, and match memory banks in the disengaged mode to obtain a current memory bank of the arithmetic data;

a generator, configured to scan the plurality of memory banks according to a determined transformation vector sequentially, and generate undetermined memory bank numbers of the plurality of memory banks sequentially, wherein a dimension of the determined transformation vector corresponds to the storage dimension of the arithmetic data;

a filler, configured to scan the storage dimension of the arithmetic data in a determined sequence to obtain the undetermined memory bank numbers, and fill elements to make the undetermined memory bank numbers continuous if the undetermined memory bank numbers of two adjacent dimensions are not continuous;

an acquirer, configured to take as a current transformation vector through a greedy algorithm the determined transformation vector where conflict is least and the number of the filling elements is smallest, wherein the generator is further configured to generate a current memory bank number of the current memory bank according to the current transformation vector, and the acquirer is further configured to convert the current memory bank number into a physical storage bank address corresponding to the current memory bank number through an offset function to obtain a corresponding internal offset address; and a memory, configured to store the arithmetic data into the plurality of memory banks according to the current memory bank numbers and the internal offset addresses.

7. The data storage device according to claim 6, wherein the generator is configured to set the determined transformation vector $\alpha=(\alpha 0, \alpha 1, \ldots, \alpha(d-1))$, scan the plurality of memory banks sequentially, and generate the undetermined memory bank numbers of the plurality of memory banks according to the following formula:

$$B(x)=(\alpha \cdot x) \% N$$

where N is a bit number of a physical memory row of any memory bank of the plurality of memory banks, and x is a physical address number of the any memory bank.

8. The data storage device according to claim 6, wherein the filler is further configured to obtain one or more discontinuous positions in the plurality of the undetermined memory bank numbers, and fill the elements in the one or more discontinuous positions to make the undetermined memory bank numbers continuous if the dimensions corresponding to the one or more discontinuous positions are adjacent.

9. The data storage device according to claim 6, wherein the acquirer is further configured to:

set an initial cycle start interval AII=0, Nb=N, where N is the memory bank number of any of the plurality of memory banks;

obtain a plurality of the determined transformation vectors without filling the memory bank numbers as an intermediate transformation vector $\alpha$;

determine whether an optimal intermediate transformation vector by minimizing a filling overhead function Padding($\alpha$) exists according to the intermediate transformation vector $\alpha$ in the case of no conflict constraints, where $\forall 0 \leq i < d$, $0 \leq \alpha i < N$;

if the optimal intermediate transformation vector exists, output the intermediate transformation vector $\alpha$ as the current transformation vector; and if the optimal intermediate transformation vector does not exist, set AII=AII+1, Nb=Nb+N, and repeat computing until the current transformation vector is obtained.

10. The data storage device according to claim 6, further comprising a reader configured to:

set a reading window covering a determined number of the memory banks; and slide the reading window along a sequence of the memory banks according to a determined sliding distance, and read as current read data memory data of the plurality of memory banks covered by the reading window at an initial position and memory data of the plurality of memory banks covered by the reading window after the reading window slides.

\* \* \* \* \*